(12) United States Patent
Benes et al.

(10) Patent No.: US 8,977,404 B2
(45) Date of Patent: Mar. 10, 2015

(54) COLLABORATIVE ENERGY BENCHMARKING SYSTEMS AND METHODS

(75) Inventors: Charles R. Benes, Denver, CO (US); Rebecca F. Premus, Broomfield, CO (US); Michael K. Ruth, Longmont, CO (US); Carol L. Stimmel, Boulder, CO (US); Adrian C. Tuck, Longmont, CO (US); Andrew J. Wheeler, San Francisco, CA (US)

(73) Assignee: Tendril Networks, Inc., Boulder, CO (US)

( * ) Notice: Subject to any disclaimer, the term of this patent is extended or adjusted under 35 U.S.C. 154(b) by 792 days.

(21) Appl. No.: 12/555,757

(22) Filed: Sep. 8, 2009

(65) Prior Publication Data

US 2010/0070102 A1   Mar. 18, 2010

Related U.S. Application Data

(60) Provisional application No. 61/095,247, filed on Sep. 8, 2008.

(51) Int. Cl.
*G05D 3/12* (2006.01)
*G06Q 30/02* (2012.01)

(52) U.S. Cl.
CPC .................................. *G06Q 30/02* (2013.01)
USPC ........................................ 700/291; 700/295

(58) Field of Classification Search
USPC ................... 700/286, 291, 295, 296
See application file for complete search history.

(56) References Cited

U.S. PATENT DOCUMENTS

| 5,179,556 | A | 1/1993  | Turner       |
|-----------|---|---------|--------------|
| 5,572,438 | A | 11/1996 | Ehlers et al.|
| 5,684,710 | A | 11/1997 | Ehlers et al.|
| 5,696,695 | A | 12/1997 | Ehlers et al.|
| 5,719,861 | A | 2/1998  | Okanoue      |
| 5,865,991 | A | 2/1999  | Hsu          |

(Continued)

FOREIGN PATENT DOCUMENTS

| WO | WO-0074306 A2 | 12/2000 |
|----|---------------|---------|
| WO | WO-1268503    | 5/2012  |

OTHER PUBLICATIONS

Retzlaff et al. "Conservation & Energy Potential Study for Smith River Rancheria", Smith River Rancheria, Evergreen NRG/Strategic Energy Solutions, Aug. 2005.*

(Continued)

*Primary Examiner* — Carlos Ortiz Rodriguez

(57) ABSTRACT

Systems and methods for providing collaborative energy benchmarking are described. Information including background data, energy consumption data, temporal data, and/or other information is gathered from multiple sources and stored in a central database. Based on the stored information, energy benchmarks are created for measuring residential energy usage. Energy usage data is displayed to consumers in multiple formats, and permits consumers to directly compare their energy usage data to other consumers or groups of consumers, in addition to their own energy usage. In some embodiments, energy challenge programs encourage reduction of energy usage. Through such programs, consumers create and present challenges for themselves and/or other consumers, such as to reduce energy usage during a given timeframe. The progress of the group and individual consumers is displayed during the course of a challenge.

21 Claims, 6 Drawing Sheets

(56) References Cited

U.S. PATENT DOCUMENTS

| | | | |
|---|---|---|---|
| 5,924,486 | A | 7/1999 | Ehlers et al. |
| 5,949,976 | A | 9/1999 | Chappelle |
| 5,959,529 | A | 9/1999 | Kail, IV |
| 6,028,857 | A | 2/2000 | Poor |
| 6,092,207 | A | 7/2000 | Kolinski et al. |
| 6,178,362 | B1 | 1/2001 | Woolard et al. |
| 6,208,247 | B1 | 3/2001 | Agre et al. |
| 6,216,956 | B1 | 4/2001 | Ehlers et al. |
| 6,631,309 | B2 | 10/2003 | Boies et al. |
| 6,640,248 | B1 | 10/2003 | Jorgensen |
| 6,680,922 | B1 | 1/2004 | Jorgensen |
| 6,684,339 | B1 | 1/2004 | Willig |
| 6,785,592 | B1 | 8/2004 | Smith et al. |
| 6,859,831 | B1 | 2/2005 | Gelvin et al. |
| 6,947,483 | B2 | 9/2005 | Engwer |
| 7,058,657 | B1 | 6/2006 | Berno |
| 7,062,389 | B2 | 6/2006 | Johnson et al. |
| 7,130,719 | B2 | 10/2006 | Ehlers et al. |
| 7,171,287 | B2 | 1/2007 | Weiss |
| 7,245,947 | B2 | 7/2007 | Salokannel et al. |
| 7,263,450 | B2 | 8/2007 | Hunter |
| 7,266,428 | B2 | 9/2007 | Alexanian |
| 7,302,634 | B2 | 11/2007 | Lucovsky et al. |
| 7,333,821 | B2 | 2/2008 | Willey |
| 7,356,548 | B1 | 4/2008 | Culp et al. |
| 7,505,852 | B2 * | 3/2009 | Board ............................ 702/33 |
| 7,552,033 | B1 | 6/2009 | Culp et al. |
| 1,016,671 | A1 | 7/2011 | Kordik et al. |
| 8,176,095 | B2 | 5/2012 | Murray et al. |
| 8,239,046 | B2 | 8/2012 | Koehler et al. |
| 2002/0002636 | A1 | 1/2002 | Vange et al. |
| 2002/0071398 | A1 | 6/2002 | Moran et al. |
| 2003/0069970 | A1 | 4/2003 | Kim et al. |
| 2003/0190912 | A1 | 10/2003 | Jampolsky et al. |
| 2004/0117330 | A1 | 6/2004 | Ehlers et al. |
| 2004/0133314 | A1 | 7/2004 | Ehlers et al. |
| 2004/0138981 | A1 | 7/2004 | Ehlers et al. |
| 2004/0139038 | A1 | 7/2004 | Ehlers et al. |
| 2004/0249515 | A1 | 12/2004 | Johnson et al. |
| 2004/0260411 | A1 | 12/2004 | Cannon |
| 2004/0262410 | A1 | 12/2004 | Hull |
| 2005/0038571 | A1 | 2/2005 | Brickfield et al. |
| 2005/0043829 | A1 * | 2/2005 | Rossides ....................... 700/91 |
| 2005/0096060 | A1 | 5/2005 | Rajkotia et al. |
| 2005/0096857 | A1 | 5/2005 | Hunter |
| 2005/0124358 | A1 | 6/2005 | Willey |
| 2005/0157723 | A1 | 7/2005 | Kim et al. |
| 2006/0200542 | A1 | 9/2006 | Willig |
| 2006/0209789 | A1 | 9/2006 | Gupta et al. |
| 2007/0043477 | A1 | 2/2007 | Ehlers et al. |
| 2007/0043478 | A1 | 2/2007 | Ehlers et al. |
| 2007/0097993 | A1 | 5/2007 | Bojahra et al. |
| 2007/0174644 | A1 | 7/2007 | Willig |
| 2007/0251461 | A1 | 11/2007 | Reichard et al. |
| 2008/0129495 | A1 | 6/2008 | Hitt |
| 2008/0263196 | A1 | 10/2008 | Kansal et al. |
| 2008/0306985 | A1 * | 12/2008 | Murray et al. ................ 707/102 |
| 2009/0007706 | A1 | 1/2009 | Hitt et al. |
| 2009/0045256 | A1 | 2/2009 | McInerney et al. |
| 2009/0059842 | A1 | 3/2009 | Maltseff et al. |
| 2010/0010678 | A1 | 1/2010 | Dawson et al. |
| 2010/0031324 | A1 | 2/2010 | Strich et al. |
| 2010/0042453 | A1 | 2/2010 | Scaramellino et al. |
| 2010/0070101 | A1 | 3/2010 | Benes et al. |
| 2010/0070102 | A1 | 3/2010 | Benes et al. |
| 2012/0323637 | A1 | 12/2012 | Cushing et al. |
| 2013/0013121 | A1 | 1/2013 | Henze et al. |

OTHER PUBLICATIONS http://www.diykyoto.com/, accessed on Aug. 9, 2010.
http://www.bluelineinnovations.com, accessed on Aug. 9, 2010.
http://www.theowl.com/, accessed on Aug. 9, 2010.
http://www.ambientdevices.com/products/energyjoule.html, accessed on Aug. 9, 2010.
http://hes.lbl.gov/consumer, accessed on Aug. 9, 2010.
http://www.greenenergyoptions.co.uk/, accessed on Aug. 9, 2010.
http://onzo.com/solutions/, accessed on Aug. 9, 2010.
http://www.opower.com/Products/Overview.aspx, accessed on Aug. 9, 2010.
http://www.alertme.com/, accessed on Aug. 9, 2010.
http://silverspringnetworks.com/products/index.html, accessed on Aug. 9, 2010.
http://www.agilewaves.com/, accessed on Aug. 9, 2010.
http://www.energyhub.net, accessed on Aug. 9, 2010.
http://www.tendrilinc.com/products/vision/,accessed on Aug. 9, 2010.
http://www.powermand.com/dreamwatts-product, accessed on Aug. 9, 2010.
http://www.energy-aware.com/, accessed on Aug. 9, 2010.
http://www.consert.com/, accessed on Aug. 9, 2010.
http://www.lem.com/hq/en/content/view/276/215/, accessed on Aug. 9, 2010.
http://www.google.com/powermeter/about/, accessed on Aug. 9, 2010.
http://blog.microsoft-hohm.com/Hohm-energy-report-sample.aspx, accessed on Aug. 9, 2010.
http://efficiency20.com/, accessed on Aug. 9, 2010.
U.S. Appl. No. 61/446,233; Inventor: Henze; filed Feb. 24, 2011, 17 pages.
Kennedy, James and Russell Eberhart. "Particle Swarm Optimization," Proceedings of the IEEE International Conference on Neural Networks (Perth, Australia), 1995, pp. 1942-1948.
Doebber, I."Investigation of Concrete Wall Systems for Reducing Heating nad Cooling Requirements in Single Family Residences" [online], Sep. 2004 [retrieved on Mar. 9, 2014]. Retrieved from the Internet<URL: http://scholar.lib.vt.edu/theses/available/etd-10262004-21448/unrestricted/FinalThesis.pdf>.
International Search Report and Written Opinion; International Application No. PCT/US2011/061470; mailed Apr. 9, 2014; 9 pages.

* cited by examiner

COLLABORATIVE ENERGY BENCHMARKING SYSTEMS AND METHODS

CROSS-REFERENCE TO RELATED APPLICATION(S)

This application claims priority to, and incorporates by reference in its entirety, U.S. Provisional Patent Application No. 61/095,247, entitled "Collaborative Energy Benchmarking System," filed on Sep. 8, 2008.

TECHNICAL FIELD

The present technology relates to systems and methods for assessing energy performance. More specifically, the present technology relates to the use of energy benchmarks to encourage energy reduction across groups of residential energy consumers.

BACKGROUND

Increasing energy usage is a growing concern. Not only does increasing energy usage strain utility grids, there is increasing public concern over the consumption of natural resources and its effects on the environment.

Commercial property owners and building managers have access to a variety of benchmark metrics that assist them in understanding the energy usage of their properties and/or buildings. In addition, these benchmark metrics allow owners and managers to compare the energy usage of their buildings to that of similar buildings. However, residential consumers have substantially fewer tools and benchmark data to assist them in understanding their own residential energy usage. Existing tools for residential consumers have focused primarily on identifying areas of a home that are candidates for reduced energy consumption. For example, existing tools provide consumers with the ability to determine the effects of a more efficient appliance, such as a refrigerator, on their overall energy consumption. Residential consumers cannot understand and/or optimize their energy usage without appropriate tools and/or benchmark data.

Energy measurement products providing energy usage data are increasingly available, including those that communicate this data across one or more networks. These products can be used to facilitate a benchmarking system for residential consumers, and permit energy usage data to be gathered and used in a more granular way.

While existing residential energy management tools provide basic energy usage data, many areas of improvement remain. For example, existing tools simply compare a consumer's energy usage data to average energy usage data. Consumers would benefit from individual challenges and/or direct comparisons, rather than simply comparisons to an average consumer. In addition, many existing tools would benefit from a more intuitive display of energy comparison data that enables consumers to more easily understand the data. Accordingly, there is a need for systems and methods that present energy usage benchmarks in ways that are easy for consumers to understand, in addition to providing consumers with the ability to compare their energy usage to other consumers.

SUMMARY

Systems and methods for providing collaborative energy benchmarking are described. Information including background data, energy consumption data, temporal data, and/or other information is gathered from multiple sources and stored in a central database. Based on the stored information, energy benchmarks are created for measuring residential energy usage. Energy benchmarks include, but are not limited to, overall energy use and efficiency of energy use. Energy usage data is displayed to consumers in multiple formats, and permits consumers to directly compare their energy usage data to other consumers or groups of consumers, in addition to their own energy usage.

In some embodiments, the techniques described herein encourage reduction of energy usage through energy challenge programs. Through such programs, consumers create and present challenges for themselves and/or other consumers, such as to reduce energy usage during a given timeframe. The techniques described herein display the progress of the group and individual consumers during the course of a challenge.

This Summary is provided to introduce a selection of concepts in a simplified form that are further described herein in the Detailed Description. This Summary is not intended to identify key features or essential features of the claimed subject matter, nor is it intended to be used as an aid in determining the scope of the claimed subject matter.

DETAILED DESCRIPTION

Systems and methods for providing collaborative energy benchmarking are described. Information including background data, energy consumption data, temporal data, and/or other information is gathered from multiple sources and stored in a central database. Based on the stored information, energy benchmarks are created for measuring residential energy usage. Energy benchmarks include, but are not limited to, overall energy use and efficiency of energy use. Energy usage data is displayed to consumers in multiple formats, and permits consumers to directly compare their energy usage data to other consumers or groups of consumers, in addition to their own energy usage. The present technology overcomes the limitations of the existing systems described above, in addition to providing other benefits.

In some embodiments, the techniques described herein encourage reduction of energy usage through energy challenge programs. Through such programs, consumers create and present challenges for themselves and/or other consumers, such as to reduce energy usage during a given timeframe. The techniques described herein display the progress of the group and individual consumers during the course of a challenge.

The present disclosure describes embodiments of consumer directed energy management systems and methods. Several specific details are set forth in the following description and in the Figures to provide a thorough understanding of certain embodiments of the disclosure. One skilled in the art, however, will understand that the present disclosure may have additional embodiments, and that other embodiments of the disclosure may be practices without several of the specific features described herein, or with additional features.

1. Embodiments of Computing Environments

Figure 1:
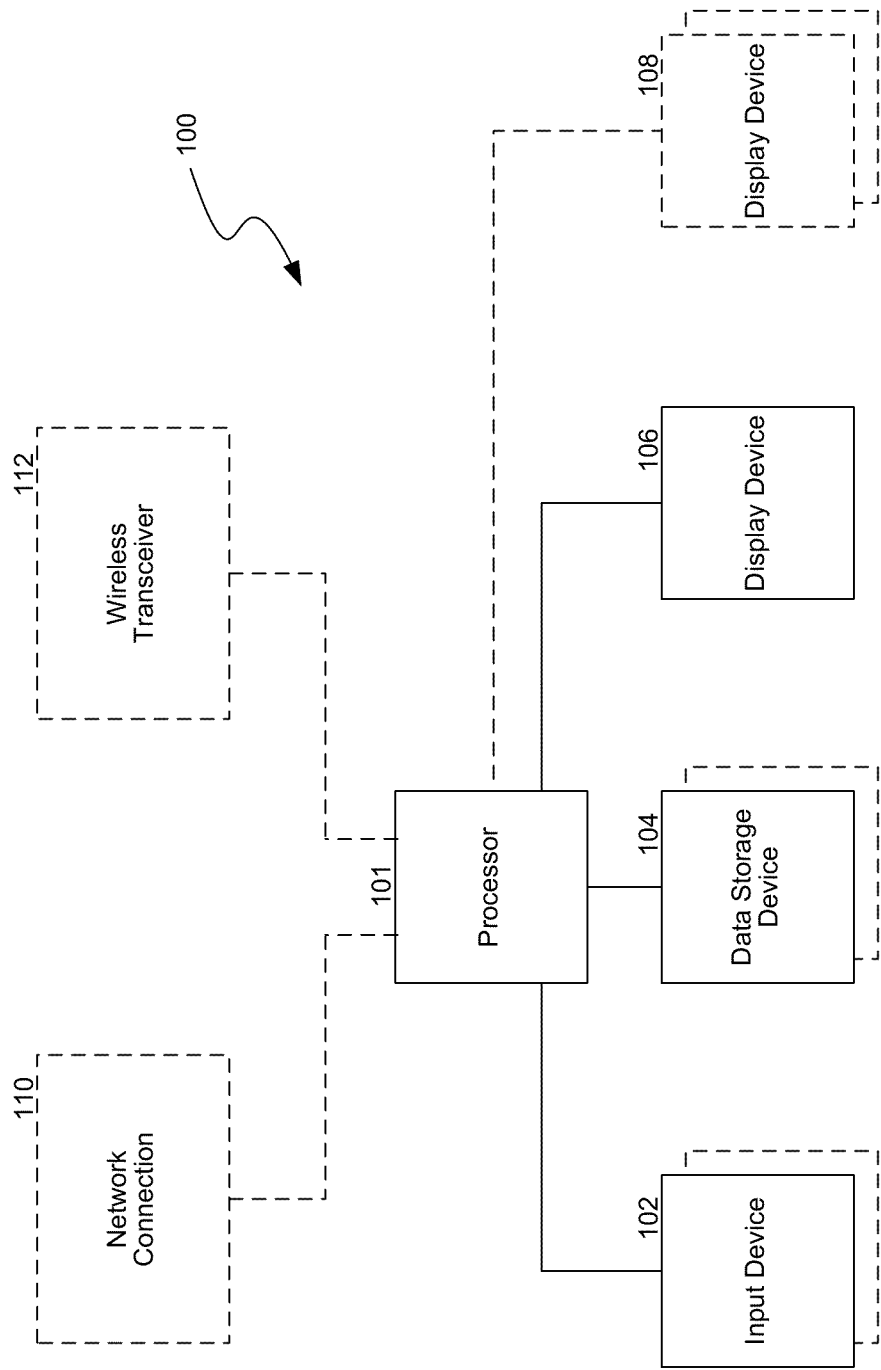
FIG. 1 is a block diagram of a computer system that may employ aspects of the disclosure.

FIG. 1 and the following discussion provide a general description of a suitable computing environment in which aspects of the disclosure can be implemented. Although not required, aspects and embodiments of the disclosure will be described in the general context of computer-executable instructions, such as routines executed by a general-purpose computer, e.g., a server or personal computer. Those skilled in the relevant art will appreciate that the disclosure can be practiced with other computer system configurations, including Internet appliances, hand-held devices, wearable computers, cellular or mobile phones, multi-processor systems, microprocessor-based or programmable consumer electronics, set-top boxes, network PCs, mini-computers, mainframe computers and the like. The disclosure can be embodied in a special purpose computer or data processor that is specifically programmed, configured, or constructed to perform one or more of the computer-executable instructions explained in detail below. Indeed, the term "computer," as used generally herein, refers to any of the above devices, as well as any data processor.

The disclosure can also be practiced in distributed computing environments, where tasks or modules are performed by remote processing devices, which are linked through a communications network, such as a Local Area Network ("LAN"), Wide Area Network ("WAN"), or the Internet. In a distributed computing environment, program modules or sub-routines may be located in both local and remote memory storage devices. Aspects of the disclosure described herein may be stored or distributed on computer-readable media, including magnetic and optically readable and removable computer discs, stored as firmware in chips (e.g., EEPROM chips), as well as distributed electronically over the Internet or over other networks (including wireless networks). Those skilled in the relevant art will recognize that portions of the disclosure may reside on a server computer, while corresponding portions reside on a client computer. Data structures and transmission of data particular to aspects of the disclosure are also encompassed within the scope of the disclosure.

Referring to FIG. 1, some embodiments of the disclosure employ a computer 100, such as a personal computer or workstation, having one or more processors 101 coupled to one or more user input devices 102 and data storage devices 104. The computer is also coupled to at least one output device such as a display device 106 and one or more optional additional output devices 108 (e.g., printer, plotter, speakers, tactile or olfactory output devices). The computer may be coupled to external computers, such as via an optional network connection 110, a wireless transceiver 112, or both.

The input devices 102 may include a keyboard and/or a pointing device such as a mouse or haptic device. Other input devices are possible such as a microphone, joystick, pen, touch screen, scanner, digital camera, video camera, and the like. The data storage devices 104 may include any type of computer-readable media that can store data accessible by the computer 100, such as magnetic hard and floppy disk drives, optical disk drives, magnetic cassettes, tape drives, flash memory cards, digital video disks (DVDs), Bernoulli cartridges, RAMs, ROMs, smart cards, and other media. Indeed, any medium for storing or transmitting computer-readable instructions and data may be employed, including a connection port to or node on a network such as a local area network (LAN), wide area network (WAN) or the Internet (not shown in FIG. 1).

Figure 2:
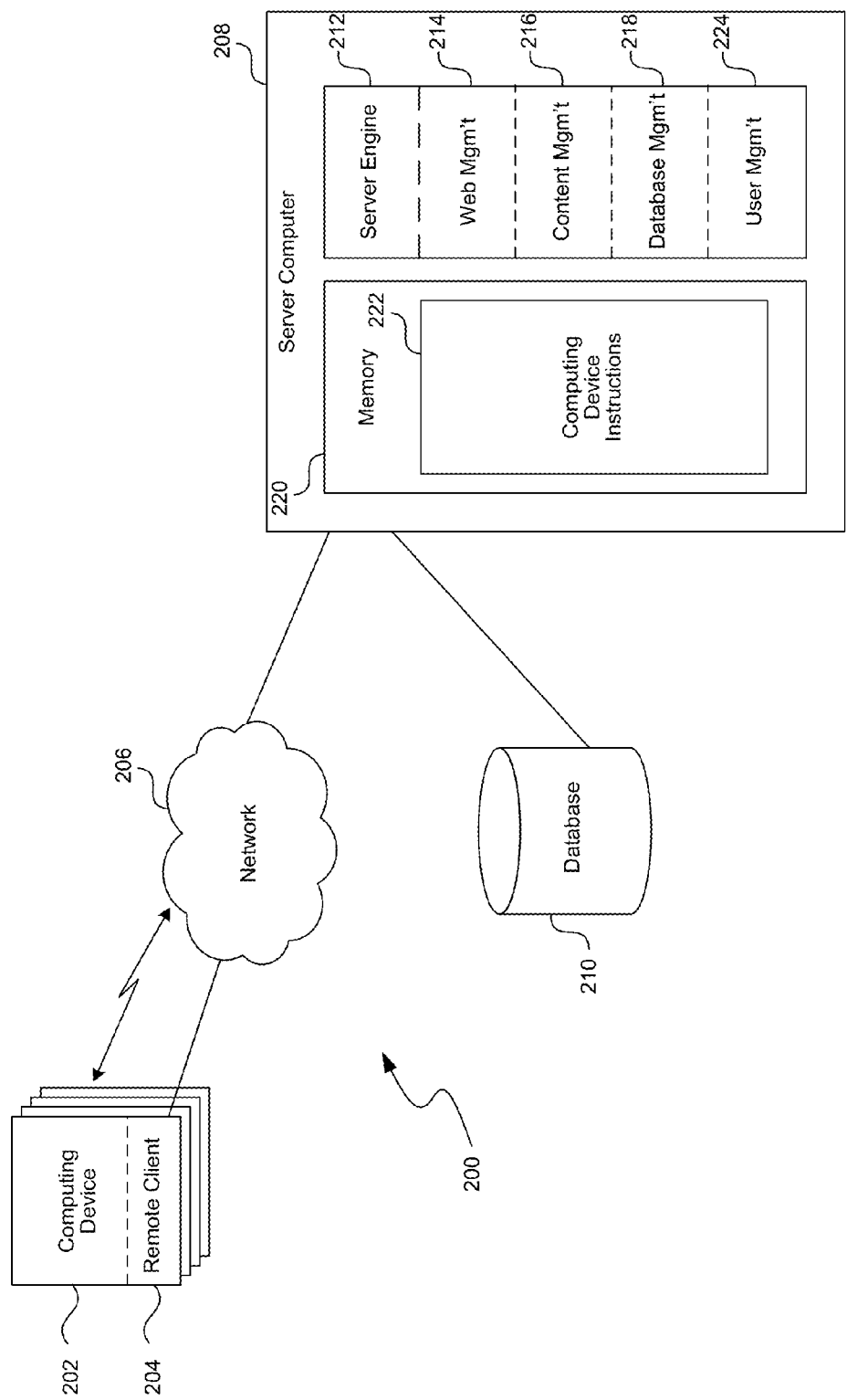
FIG. 2 is a block diagram of a computer system in which aspects of the disclosure may operate in a networked computer environment.

Aspects of the disclosure may be practiced in a variety of other computing environments. For example, referring to FIG. 2, a distributed computing environment with a network interface includes one or more computing devices 202 (e.g., a client computer) in a system 200, each of which includes a remote client module 204 that permits the computing device to access and exchange data with the network 206 (e.g., Internet or intranet), including web sites within the World Wide Web portion of the Internet. The computing devices 202 may be substantially similar to the computer described above with respect to FIG. 1. Computing devices 202 may include other program modules such as an operating system, one or more application programs (e.g., word processing or spreadsheet applications), and the like. The computing devices 202 may be general-purpose devices that can be programmed to run various types of applications, or they may be single-purpose devices optimized or limited to a particular function or class of functions. While shown with remote client applications using Internet protocols or proprietary communication protocols for communication via network 206, any application program (e.g., network browser) for providing a graphical user interface to users may be employed, as described in detail herein.

At least one server computer 208, coupled to the network 206 (e.g., Internet or intranet) 206, performs many or all of the functions for receiving, routing, and storing electronic messages, such as web pages, data streams, audio signals, and electronic images. While the Internet is discussed, a private network, such as an intranet, may indeed be preferred in some applications. The network may have a client-server architecture, in which a computer is dedicated to serving other client computers, or it may have other architectures such as peer-to-peer, in which one or more computers serve simultaneously as servers and clients. In some embodiments, a database 210 or databases, coupled to the server computer(s), can store much of the content exchanged between the computing devices 202 and the server 208. The server computer(s), including the database(s), may employ security measures to inhibit malicious attacks on the system, and to preserve integrity of the messages and data stored therein (e.g., firewall systems, secure socket layers (SSL), password protection schemes, encryption, and the like).

The server computer 208 can also contain an internal memory component 220. The memory 220 can be standard memory, secure memory, or a combination of both memory types. The memory 220 and/or other data storage device 210 can contain computer readable media having computing device instructions 222. The encoded computing device instructions 222 are electronically accessible to at least one of the computing devices 208 and 202 for execution. In further embodiments, computing device instructions 222 can include basic operating instructions (e.g., source code) or other instructions.

The server computer 208 may include a server engine 212, a web page management component 214, a content management component 216, a database management component 218 and a user management component 224. The server engine performs basic processing and operating system level tasks. The web page management component 214 handles creation and display or routing of web pages. Users may access the server computer by means of a URL associated therewith. The content management component 216 handles most of the functions in the embodiments described herein. The database management component 218 includes storage and retrieval tasks with respect to the database 210, queries to the database, read and write functions to the database and storage of data such as video, graphics, and audio signals. The user management component 224 can support authentication of a computing device to the server 208.

Many of the functional units described herein have been labeled as modules, in order to more particularly emphasize their implementation independence. For example, modules may be implemented in software for execution by various types of processors, such as processor 101. An identified module of executable code may, for instance, comprise one or more physical or logical blocks of computer instructions which may, for instance, be organized as an object, procedure, function, or algorithm. The identified blocks of computer instructions need not be physically located together, but may comprise disparate instructions stored in different locations which, when joined logically together, comprise the module and achieve the stated purpose for the module.

A module may also be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

A module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

2. Collaborative Energy Benchmarking Systems and Methods

Systems and methods for providing collaborative energy benchmarking are described. Information including background data, energy consumption data, temporal data, and/or other information is gathered from multiple sources and stored in a central database. Based on the stored information, energy benchmarks are created for measuring residential energy usage. Energy benchmarks include, but are not limited to, overall energy use and efficiency of energy use. Energy usage data is displayed to consumers in multiple formats, and permits consumers to directly compare their energy usage data to other consumers or groups of consumers, in addition to their own energy usage.

In some embodiments, the techniques described herein encourage reduction of energy usage through energy challenge programs. Through such programs, consumers create and present challenges for themselves and/or other consumers, such as to reduce energy usage during a given timeframe. The techniques described herein display the progress of the group and individual consumers during the course of a challenge.

Figure 3:
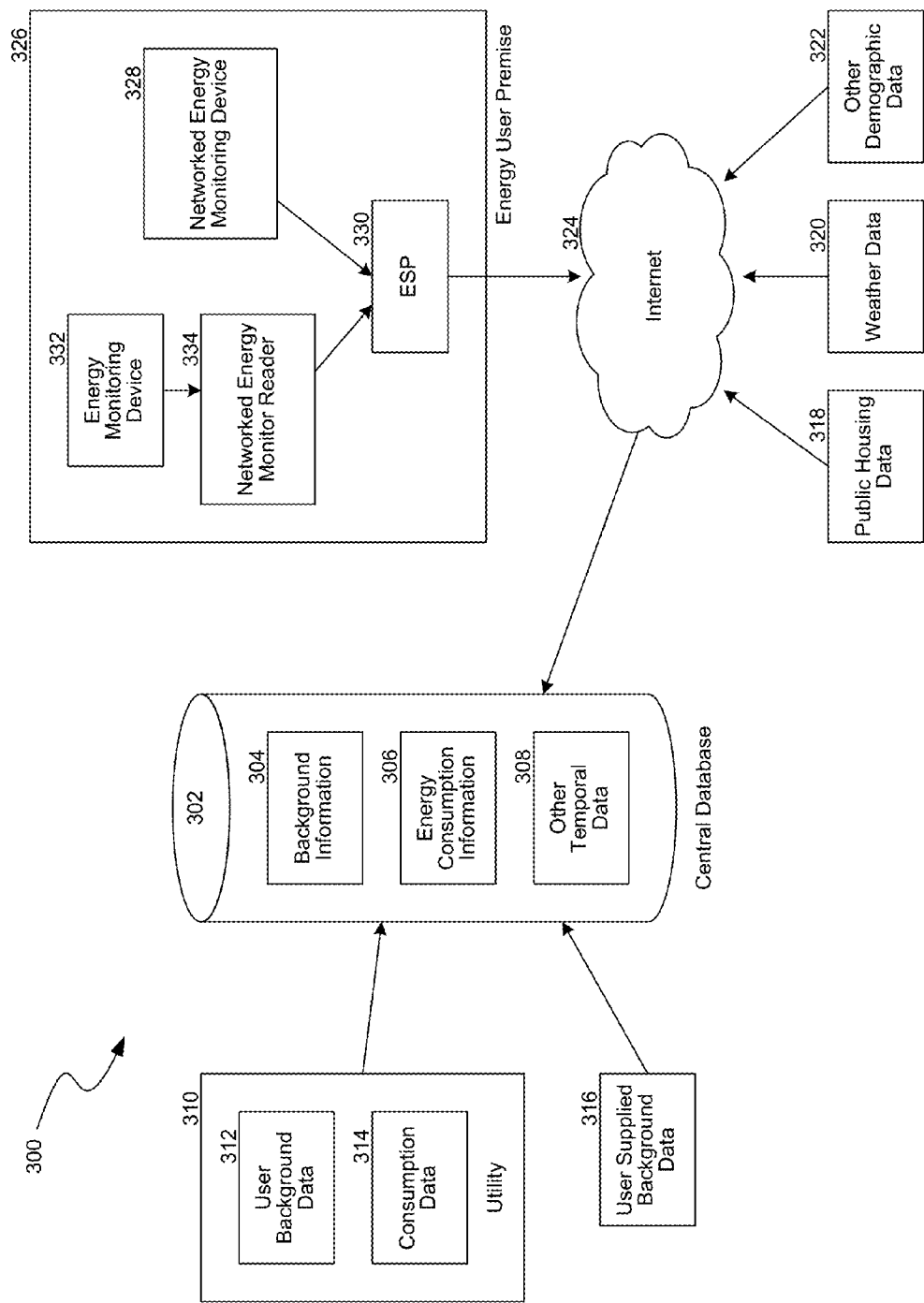
FIG. 3 is a block diagram of data sources of a system for providing collaborative energy benchmarking in accordance with embodiments of the disclosure.

FIG. 3 is a block diagram of data sources of a system 300 for providing collaborative benchmarking in accordance with embodiments of the disclosure. The system 300 comprises multiple components for gathering and storing data relevant to the creation of energy benchmarks. As described in additional detail herein, data used for the creation of benchmarks includes background information 304, energy consumption information 306, temporal data 308, and other information. This information is stored in a central database 302.

Background information 304 includes information about consumers and their residential properties, and is collected from multiple sources. For example, a utility 310 can directly provide user background data 312 to the central database 302. The user background data 312 can be provided to the central database 302, for example, at the time a consumer joins the system, or any time thereafter. In addition, when a consumer joins the system or at any time thereafter, the consumer can supply background data 316 to the central database 302. Background data includes, but is not limited to, the location, size (e.g., square footage), age, and construction materials of a residence; information about heating and/or cooling systems; information about residential energy consuming devices; type of residence (e.g., primary residence, vacation home, rental property); information about the consumers of energy in the residence (e.g., number of consumers, ages of consumers); and/or other background data.

In some embodiments, the system 300 also obtains background information 304 from public sources of data, such as public housing data 318. Public sources 322 of background information 304 can include property tax databases that include information about the size, age, and construction materials of residences; census databases that provide demographic information about residences and consumers; and other public databases. In some embodiments, background information 304 is provided to the central database 302 via a network, such as the Internet 324.

The techniques described herein also collect and store energy consumption information 306. Energy consumption information 306 includes information representing the actual usage data of the residential properties, and is also obtained from multiple sources. For example, a utility provider 310 can provide consumption data 314 to the central database 302. The utility provider 310 collects such consumption data 314 for the purposes of billing the consumer.

Because the consumption data 314 collected by a utility provider 310 is often not of a very fine granularity (e.g., this data may only be obtained on a monthly basis), and/or because the consumption data 314 may not be available directly to the central database 302, it is desirable to have alternative sources of energy usage data. As depicted in FIG. 3, the system 300 collects data directly and automatically from a consumer's residential premises 326 through the use of energy monitoring devices 328 and 332. The energy monitoring devices 328 and 332 transmit energy consumption information to an Energy Service Portal (ESP) device 330, which in turn transmits the information to the central database 302 for storage. In some embodiments, energy monitoring devices 328 (e.g., a networked utility meter or an individual circuit monitoring device) are directly connected to the ESP device 330 via an in-home network, while in other embodiments, energy monitoring devices 332 (e.g., a non-networked electricity meter) are not network connected, but provide information to the ESP device 330 indirectly via a networked energy monitor reader 334. In some embodiments, the ESP device 330 functions may reside in one or more of the energy monitoring devices 328 and 332.

The in-home network can be a wired and/or wireless network. In some embodiments, the in-home network includes devices configured according to a single network technology, while in other embodiments, the in-home network includes devices configured according to multiple network technologies. Available network technologies include, but are not limited to, IEEE 802.11/WiFi, IEEE 802.15.4/ZigBee, Homeplug, and other network technologies.

Temporal data 308 includes information, such as weather data, that may affect the patterns of energy consumption. Weather data 320 can include high and low temperatures for a given local area, the number of heating and cooling degree days experienced in the local area, and other weather data. In some embodiments, temporal information 308 is provided to the central database 302 via a network, such as the Internet 324. Although the network over which temporal information 308 is provided is depicted as the same network over which public sources of background information 304 are provided, one skilled in the art will appreciate that these may be different networks.

Figure 4:
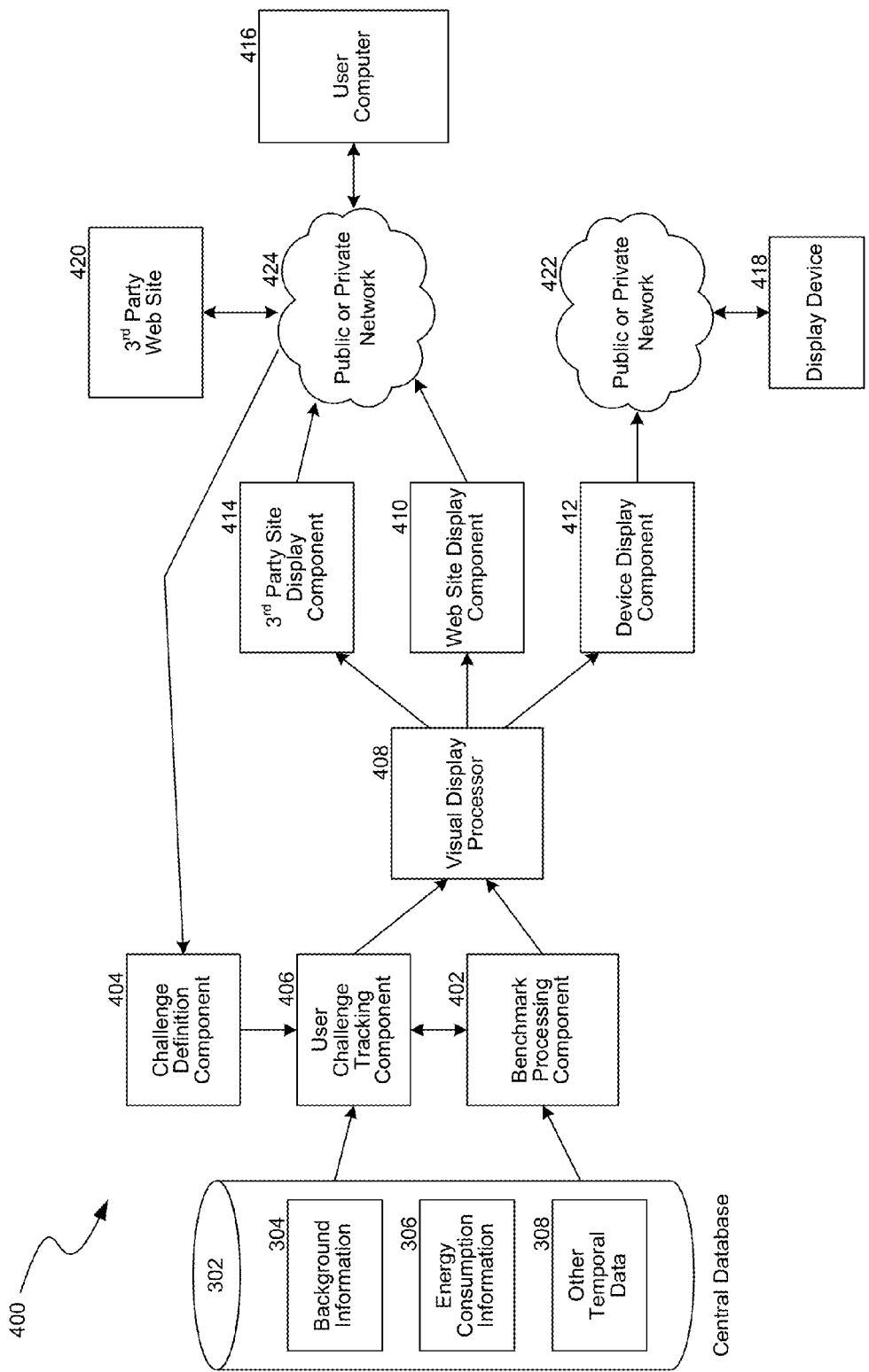
FIG. 4 is a block diagram of processing and display components of a system for providing collaborative energy benchmarking in accordance with embodiments of the disclosure.

Once information has been collected and stored, such as in a manner depicted in FIG. 3, the techniques described herein create and display energy benchmarks. FIG. 4 is a block diagram of processing and display components of a system 400 for providing collaborative energy benchmarking in accordance with embodiments of the disclosure. These components provide the capability to create benchmarks, display the created benchmarks to consumers, and create energy conservation challenges using the created benchmarks, in addition to other capabilities.

A benchmark processing component 402 utilizes the data stored in the central database 302 to generate benchmarks of energy usage. Benchmarks can be of a variety of different types, including benchmarks that measure overall energy usage (e.g., the total amount of energy used during a given timeframe), the efficiency of energy usage (e.g., the amount of energy used to achieve a given heating or cooling effect), and other types of benchmarks.

In some embodiments, the system 400 encourages reduction of energy usage through challenge programs. This functionality is provided by a challenge definition component 404 and a user challenge tracking component 406. The challenge definition component 404 allows consumers to define challenges for themselves and other consumers. Challenges can be of a variety of formats, including specific timeframe challenges between or amongst groups of consumers, challenges that are specific to an individual consumer, and other challenge formats.

Examples of challenges that can be defined include, but are not limited to, (1) reduce energy usage of a group of consumers by a percentage amount for a given timeframe (e.g., reduce energy usage for the current month by 10% from the previous month); (2) reduce energy usage by more than another group participating in the challenge (e.g., six neighborhoods each attempt to reduce energy usage by more than the other neighborhoods for a given week); (3) a single consumer sets a challenge to reduce his or her energy usage for a given timeframe, compared with a different timeframe (e.g., reduce this July's energy usage by 5% from last July's energy usage). These example challenges are provided for illustrative purposes only. One skilled in the art will appreciate that a variety of other challenges are contemplated by the techniques described herein.

The techniques described herein calculate the amount of energy reduction that is required from individual consumers and from the group as a whole to meet a challenge. The techniques described herein display the progress of the group and each consumer during the course of the challenge. For example, a consumer's progress may be displayed relative to other consumers in the group. Consumers are encouraged to perform better than other consumers through this display.

The user challenge tracking component 406 obtains challenge definitions from the challenge definition component 404, and uses information from the benchmark processing component 402 and the central database 302 to measure the performance of the consumers participating in a challenge against the goals of that challenge.

In some embodiments, definitions of groups of consumers for challenges and of the challenges themselves are provided by consumers through a user interface, such as a web based user interface. Alternatively or additionally, these definitions may be provided by one or more external system user interfaces, such as social networking web sites (e.g., MySpace or Facebook). The system 400 can utilize these external systems for group definition, such as by presenting a user interface on these systems for challenge definition.

As described above, a major shortcoming of existing tools for measuring and displaying energy consumption to consumers is the complexity of presented benchmarks and displays. In accordance with the techniques described herein, a visual display processor 408 obtains benchmark information from the benchmark processing component 402 and challenge performance information from the user challenge tracking component 406. The visual display processor 408 generates simple displays of benchmark information and/or challenge performance information, for the purposes of communicating energy performance information to consumers who are not specialists in the field of energy consumption. These benchmarks are presented in a variety of visual and numeric formats that allow consumers to easily visualize their energy usage and compare their energy usage to other consumers.

Figure 5:
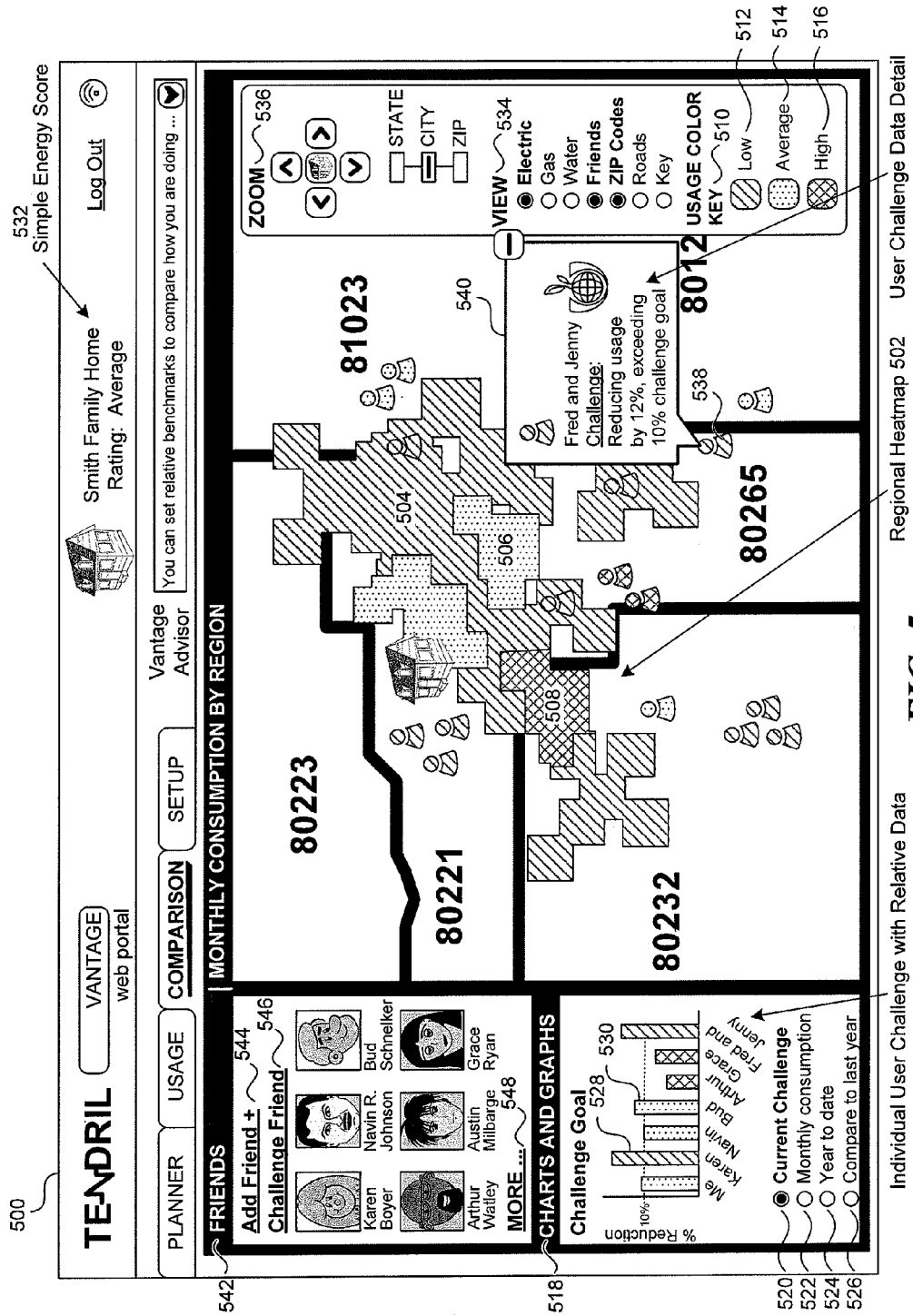
FIG. 5 is a screenshot of a user interface for presenting benchmark data to consumers.

FIG. 5 is a screenshot of a user interface 500 for presenting benchmark data to consumers in accordance with embodiments of the disclosure. FIG. 5 illustrates several outputs of the visual display processor 408 of FIG. 4. These outputs are provided for illustrative purposes only. One skilled in the art will appreciate that a variety of other outputs are contemplated by the techniques described herein.

The user interface 500 includes a regional "heatmap" 502 that displays energy usage information associated with a geographic area. Among other benefits, the regional heatmap 502 enables consumers to quickly and easily visualize the energy usage of the displayed geographic area. In some embodiments, the visual display processor 408 converts the benchmark numbers obtained from the benchmark processing component 402 of FIG. 4 into a simple scale. The scale can be represented by colors or otherwise distinguished in order to display differences in energy usage (e.g., low/average/high usage, or ranges of usage numbers).

For example, for a benchmark that indicates the amount of energy used per month in kilowatt-hours/month (kWh/month), the visual display processor 408 can use the following procedure: (1) calculate the mean (M) and standard deviation (StDev) of the benchmark data; (2) assign all benchmarks less than M−(1.5×StDev) the color green, to represent low energy usage; (3) assign all benchmarks greater than M+(1.5×StDev) the color red, to represent high energy usage; and (4) assign all remaining benchmarks the color yellow to represent average energy usage. This suitable procedure is provided for illustrative purposes only. One skilled in the art will appreciate that a variety of other processes may be used to convert benchmark numbers into a representative scale.

The visual display processor 408 takes background information 304, such as location data, from the central database 302 and constructs a regional heatmap 502 containing the benchmark colors for various location. Among other benefits, such a display of information allows a consumer to compare energy consumption across a geographic area and simplifies the consumer's understanding of energy consumption data. In the example depicted in FIG. 5, the regional heatmap 502 includes multiple benchmark color regions, including regions 504, 506, and 508. As indicated by the usage color key 510, the region 504 is associated with low 512 energy usage, the region 506 is associated with average 514 energy usage, and the region 508 is associated with high 516 energy usage.

A consumer can change the information displayed on the regional heatmap 502 by selecting and/or deselecting options in the views area 534. For example, the consumer can select which types of energy usage are displayed, such as electric, gas, and/or water. In addition, a consumer can choose to have his or her friends, such as friend 538, displayed on the regional heatmap 502. The consumer can also select to display various boundaries, such as zip codes and/or roads, and/or to display a key that provides more information about the selected data. In addition, the consumer can change the displayed portion of the regional heatmap 502 by selecting various options in the zoom area 536.

By selecting a displayed friend 538 on the regional heatmap 502 (e.g., by clicking on or letting a selection device hover over the friend 538), the consumer can view additional information 540 about the selected friend 538. In the example depicted in FIG. 5, the information 540 includes the names of the selected friend 538 (i.e., Fred and Jenny) and indicates how the selected friend 538 is doing in the current challenge (i.e., Reducing usage by 12%, exceeding 10% challenge goal).

In some embodiments, the visual display processor 408 displays output from the user challenge tracking component 406 in the form of one or more charts and/or bar graphs 518 illustrating the performance of challenge participants. For example, a bar graph may represent the performance of each challenge participant relative to the other participants. A variety of charts and bar graphs 518 may be presented, including, but not limited to, representations of a current challenge 520, monthly consumption 522, year to date consumption 524, and a consumption comparison to last year 526. In some embodiments, the associated benchmark for a consumer is converted into a color, such as by a process similar to that described above for the regional heatmap 502. In the example depicted in FIG. 5, a bar 528 represents low energy usage, while a bar 530 represents average energy usage.

In some embodiments, the visual display processor 408 also presents to consumers with a simple measurement of their energy usage, such as a simple energy score 532. In the example depicted in FIG. 5, the consumer's simple energy score 532 is "average." Among other benefits, the simple energy score 532 allows the consumer to quickly and easily determine his or her energy consumption relative to other consumers in the challenge group. In some embodiments, the visual display processor 408 simplifies multiple raw benchmark numbers into a single simple energy score 532.

For example, the visual display processor 408 may construct a simple energy score 532 according to the following process: (1) select only consumers similar to a given consumer for whom a score is to be generated (e.g., consumers with residences of similar size and in the same geographic area); (2) calculate the mean (M) and standard deviation (StDev) of the energy consumption for a given timeframe for the group selected in step 1; (3) if the consumer's energy consumption is above M+StDev, assign the consumer a score of "Worse than Average"; (4) if the consumer's energy score is below M−StDev, assign the consumer a score of "Better than Average"; (5) otherwise, assign the consumer a score of "Average." Alternatively or additionally, the simple energy score 532 can be expressed as a numerical score. Among other benefits, such a numerical score provides more granularity of displayed information, while still reducing the complexity of the information displayed to the consumer.

The user interface 500 also displays information associated with friends and/or other consumers in a current challenge 542. In the example depicted in FIG. 5, a photo and name is displayed for each challenge friend 546. While only a certain number of challenge friends 546 (e.g., six friends) may be displayed by default, a consumer can see more challenge friends 548 by selecting a more link 548. A consumer can add friends to the display by selecting an add friend link 544. In some embodiments, consumers specify particular individual consumers or groups of consumers to be compared to, while in other embodiments, the system selects the individual and/or groups of consumers for comparison, such as based on background data stored in the database.

In some embodiments, consumers specify the amount and/or type of consumption and background data that is shared with other consumers. Consumers may share different amounts and/or types of data with different groups of consumers. For example, a group of "friends" may be able to see more detailed information about a consumer than other consumers who are not friends.

The displays generated by the visual display processor 408, such as those displays depicted in FIG. 5, are displayable to consumers through multiple mechanisms. These display mechanisms include, but are not limited to, a web site display component 410, a display device component 412, and a third party web site display component 414. The web site display component 410 presents the displays generated by the visual display processor 408 on a consumer's computer 416 via a network 424. In some embodiments, the network 424 is a public network (e.g., Internet or an intranet), while in other embodiments, the network 424 is a private network (e.g., a Meter Reading Network or an Advanced Metering Infrastructure Network).

The display device component 412 presents the displays generated by the visual display processor 408 on a display device 418, such as a dedicated energy monitor, via a network 422. Dedicated energy monitors are described in additional detail in reference to FIG. 6. In some embodiments, the network 422 is a public network (e.g., Internet or an intranet), while in other embodiments, the network 422 is a private network (e.g., a Meter Reading Network or an Advanced Metering Infrastructure Network). While the networks 422 and 424 are depicted as separate networks, one skilled in the art will appreciate that the networks 422 and 424 may be the same network.

Figure 6:
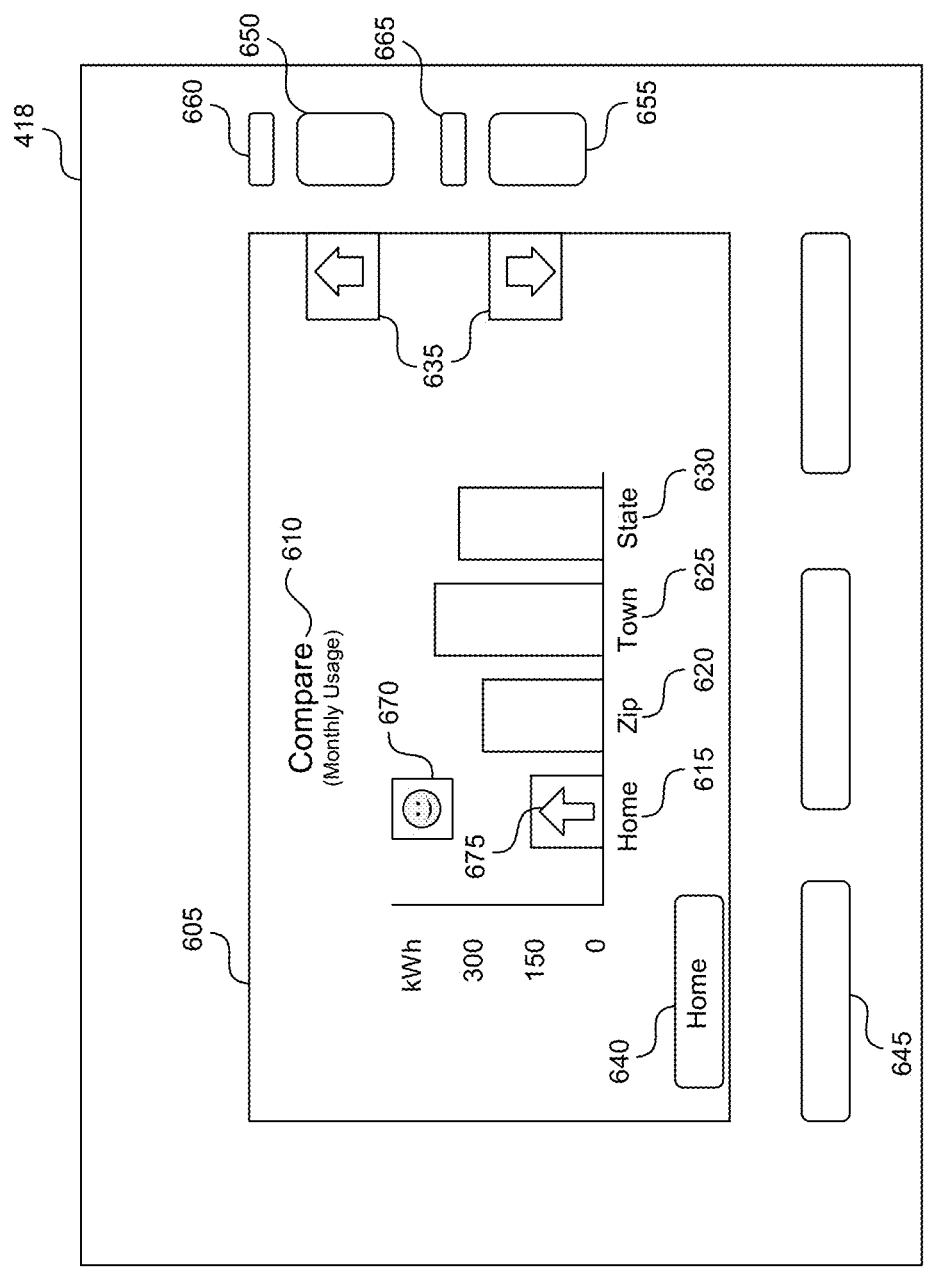
FIG. 6 is a block diagram of a display device for displaying benchmark data.

FIG. 6 is a block diagram of a display device 418 on which the display device component 412 may present the displays generated by the visual display processor 408. The display device 418 includes a user interface 605 for displaying benchmark data. Because the display device 418 may have limited display size and/or functionality, the display device component 412 performs additional processing to simplify the displayed information. For example, the display device component 412 may process the information in order to match the capabilities of the display device 418.

The device based user interface 605 has a Compare area 610 that includes a bar graph comparing the monthly energy usage of the consumer's home 615 to other groups of consumers, such as those in the consumer's zip code 620, town 625, and/or state 630. The device based user interface 605 can provide the consumer with an at-a-glance indication of how the consumer is doing, such as via one or more icons 670 and 675.

In some embodiments, the Compare 610 displays the current month as the selected month by default. The consumer can select another month by using buttons 650 and 655 that correspond to arrows 635, by selecting a Home menu 640 via button 645, or in another manner. In some embodiments, the consumer presses the buttons 650 and/or 655 for a short duration to access a previous or subsequent month, respectively, and presses the buttons 650 and/or 655 for a longer duration to select a different display, such as a different bar graph. While the bar graph depicted in FIG. 6 displays monthly energy usage, one skilled in the art will appreciate that a variety of other displays are possible, including charts and/or graphs of energy usage for different timeframes. Alternatively or additionally, the user interface 605 can display text, animations, videos, and/or a variety of other presentations of information. The consumer can modify device 418 settings by selecting the Home 640 via associated button 645, or in another manner.

The display device 418 may include a variety of indicators 660 and 665 to communicate information to the consumer. For example, indicators 660 and 665 may be light emitting diodes (LEDs) that communicate display device 418 status information to the consumer, such as whether the display device 418 is on or off, a currently active setting, and/or a variety of other status information.

Alternatively or additionally, a third party web site display component 414 presents the displays generated by the visual display processor 408 on a third party web site 420 via the network 424. In some embodiments, the network 424 is a public network (e.g., Internet or an intranet), while in other embodiments, the network 424 is a private network (e.g., a Meter Reading Network or an Advanced Metering Infrastructure Network). Although the network 424 over which the web site display component 410 transmits data to the consumer's computer 416 and the network 424 over which the third party web site display component 414 transmits information to the third party web site 420 are depicted as the same network, one skilled in the art will appreciate that these may be separate networks.

3. Conclusion

Various embodiments of the disclosure are described herein. It will be appreciated that details set forth herein are provided to describe the embodiments in a manner sufficient to enable a person skilled in the relevant art to make and use the disclosed embodiments. Several of the details and advantages, however, may not be necessary to practice some embodiments. Additionally, some well-known structures or functions may not be shown or described in detail, so as to avoid unnecessarily obscuring the relevant description of the various embodiments. Furthermore, features, structures, or characteristics of various embodiments may be combined in any suitable manner.

Moreover, one skilled in the art will recognize that there are a number of other technologies that could be used to perform functions similar to those described herein. While processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The terminology used in the description is intended to be interpreted in its broadest reasonable manner, even though it is being used in conjunction with a detailed description of identified embodiments. Moreover, the headings provided herein are for convenience only.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

Any patents, applications and other references, including any that may be listed in accompanying filing papers, are incorporated herein by reference. Aspects of the disclosure can be modified, if necessary, to employ the systems, functions, and concepts of the various references described above to provide yet further embodiments.

These and other changes can be made in light of the above Detailed Description. While the disclosure details certain embodiments and describes the best mode contemplated, no matter how detailed, various changes can be made. Implementation details may vary considerably, while still being encompassed by the disclosure.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A system for providing collaborative energy benchmarking, wherein the system comprises:
  a database configured to:
    for each of a plurality of consumers,
      store information associated with residential energy usage of the consumer;
      store background information about at least one residential property of the consumer, the background information about the at least one residential property of the consumer comprising,
        information about the size of the at least one residential property of the consumer,
        information about the age of the at least one residential property of the consumer, and
        information about construction materials of the at least one residential property of the consumer; and
      provide at least a portion of the information associated with the residential energy usage of the consumer to a benchmark processing component;
  the benchmark processing component configured to:
    for each of a subset of the plurality of consumers,
      receive at least a portion of the information associated with the residential energy usage of the consumer from the database;
      receive at least a portion of the background information about the at least one residential property of the consumer from the database, wherein the received at least a portion of the background information about the at least one residential property of the consumer comprises the information about the size of the at least one residential property of the consumer, the information about the age of the at least one residential property of the consumer, and the information about construction materials of the at least one residential property of the consumer;

create one or more energy benchmarks that measure the residential energy usage of the consumer, wherein the one or more energy benchmarks are created based at least in part on the received information associated with the residential energy usage of the consumer and the received background information about the at least one residential property of the consumer, including the information about the size of the at least one residential property of the consumer, the information about the age of the at least one residential property of the consumer, and the information about construction materials of the at least one residential property of the consumer; and provide the one or more energy benchmarks to a visual display processor;

the visual display processor being configured to:
receive the one or more energy benchmarks from the benchmark processing component;
create an energy performance display that communicates the one or more energy benchmarks to at least one consumer;
provide the energy performance display to a display component for presentation to the at least one consumer;

a challenge definition component configured to:
receive a challenge definition from the consumer, wherein the received challenge definition defines an energy conservation challenge associated with reducing residential energy usage and that is based on at least one of the created one or more energy benchmarks and wherein the received challenge definition includes an indication of a group of at least two different consumers to which the challenge applies; and a consumer challenge tracking component configured to:
measure performance of each consumer of the group of at least two different consumers according to the received challenge definition.

2. The system of claim 1 wherein the information associated with the residential energy usage of the consumer comprises energy consumption information associated with a residential property of the consumer.

3. The system of claim 1 wherein the information associated with the residential energy usage of the consumer comprises temporal information that affects a pattern of the residential energy usage.

4. The system of claim 1 wherein the challenge definition is received from the consumer via a user interface.

5. The system of claim 1, further comprising:
a consumer challenge tracking component configured to:
receive the challenge definition from the challenge definition component;
receive the one or more energy benchmarks from the benchmark processing component;
measure performance of the consumer according to the received challenge definition; and
provide an indication of the measured performance to the visual display processor,
wherein the visual display processor further receives the indication of the measured performance from the consumer challenge tracking component, and wherein the energy performance display further communicates the received indication of the measured performance to the consumer.

6. The system of claim 1 wherein the one or more energy benchmarks include overall energy use and efficiency of energy use.

7. The system of claim 1, further comprising:
a monitoring component configured to monitor the progress of the group of at least two different consumers with respect to the challenge.

8. The system of claim 7, further comprising:
a component configured to, for each of the at least two different consumers, generate an indication of the individual progress of the consumer with respect to the challenge.

9. The method of claim 8, further comprising:
a component configured to generate an indication of the progress of the group of at least two different consumers with respect to the challenge.

10. A method, performed by a computing system having a processor, the method comprising:
receiving information associated with energy usage of a consumer;
creating, based on at least a portion of the received information, one or more energy benchmarks that measure the energy usage of the consumer, wherein at least one of the one or more energy benchmarks is created based at least in part on background information about at least one residential property of the consumer;
creating, with the processor, an energy performance display configured to communicate the one or more energy benchmarks to the consumer;
receiving a challenge definition from the consumer, wherein the received challenge definition defines an energy conservation challenge associated with reducing energy usage and that is based on at least one of the created one or more energy benchmarks and wherein the received challenge definition includes an indication of a group of at least two different consumers to which the challenge applies; and
measuring performance of each consumer of the group of at least two different consumers according to the received challenge definition.

11. The method of claim 10, further comprising:
monitoring the progress of the group of at least two different consumers with respect to the challenge, wherein the group of at least two different consumers includes at least two different consumers; and
for each of the at least two different consumers, displaying an indication of the individual progress of the consumer with respect to the challenge.

12. The method of claim 11, further comprising:
providing for display an indication of the progress of the group of at least two different consumers with respect to the challenge.

13. The method of claim 10 wherein the background information about the at least one residential property of the consumer comprises information about the age of the at least one residential property of the consumer and information about construction materials of the at least one residential property of the consumer.

14. A computer-readable memory storing instructions that, if executed by a computing system having a processor, cause the computing system to perform operations for providing collaborative energy benchmarking, the instructions comprising:

instructions for receiving information associated with energy usage of a first consumer;

instructions for creating, based at least in part on the received information, one or more energy benchmarks that measure the energy usage of the first consumer, wherein at least one of the one or more energy benchmarks is created based at least in part on background information about at least one residential property of the first consumer;

instructions for creating, with the processor, an energy performance display configured to communicate the one or more energy benchmarks to the first consumer;

instructions for receiving a challenge definition from the first consumer, wherein the received challenge definition defines an energy conservation challenge associated with reducing energy usage and that is based on at least one of the created one or more energy benchmarks and wherein the received challenge definition includes an indication of a group of at least two different consumers to which the challenge applies; and instructions for measuring performance of each consumer of the group of at least two different consumers according to the received challenge definition.

15. The computer-readable memory of claim 14, the instructions further comprising:

instructions for monitoring the progress of the group of at least two different consumers with respect to the challenge, wherein the group of at least two different consumers includes at least the first consumer and a consumer other than the first consumer; and instructions for displaying, for each consumer of the group of at least two different consumers, an indication of the individual progress of the consumer with respect to the challenge.

16. The computer-readable memory of claim 15, wherein the group of at least two different consumers is based on a geographical area associated with the first consumer.

17. The computer-readable memory of claim 14, the instructions further comprising:

instructions for identifying consumers similar to the first consumer based at least in part on the received background information about the at least one residential property of the first consumer;

instructions for determining, for each of a plurality of the identified consumers, a benchmark number based on at least one of the one or more energy benchmarks;

instructions for calculating a mean benchmark number (M) based on the determined benchmark numbers;

instructions for calculating a standard deviation (StDev) based on the determined benchmark numbers;

instructions for identifying a first sub-group of consumers from among the identified group of consumers based at least in part on the sum of M and StDev; and instructions for identifying a second sub-group of consumers from among the identified consumers based at least in part on the difference between M and StDev.

18. The computer-readable memory of claim 14 wherein the background information about the at least one residential property of the first consumer comprises information about the location of the at least one residential property of the first consumer and information about the size of the at least one residential property of the first consumer.

19. The computer-readable memory of claim 14, the instructions further comprising:

instructions for receiving a challenge definition from the first consumer, wherein the defined challenge is associated with reducing energy usage.

20. The computer-readable memory of claim 14 wherein at least one of the created one or more energy benchmarks that measure the energy usage of the first consumer measures the efficiency of energy use and wherein at least one of the created one or more energy benchmarks that measure the energy usage of the first consumer measures overall energy use.

21. A computer-readable memory storing instructions that, if executed by a computing system having a processor, cause the computing system to perform operations for providing collaborative energy benchmarking, the instructions comprising:

instructions for receiving information associated with energy usage of a first consumer;

instructions for creating, based at least in part on the received information, one or more energy benchmarks that measure the energy usage of the first consumer, wherein at least one of the one or more energy benchmarks is created based at least in part on background information about at least one residential property of the first consumer;

instructions for creating, with the processor, an energy performance display configured to communicate the one or more energy benchmarks to the first consumer;

instructions for receiving a challenge definition from the first consumer, wherein the defined challenge is associated with reducing energy usage;

instructions for identifying consumers similar to the first consumer based at least in part on the background information about the at least one residential property of the first consumer;

instructions for determining, for each of a plurality of the identified consumers, a benchmark number based on at least one of the one or more energy benchmarks;

instructions for calculating a mean benchmark number (M) based on the determined benchmark numbers;

instructions for calculating a standard deviation (StDev) based on the determined benchmark numbers;

instructions for identifying a first sub-group of consumers from among the identified group of consumers based at least in part on the sum of M and StDev;

instructions for identifying a second sub-group of consumers from among the identified group of consumers based at least in part on the difference between M and StDev;

instructions for displaying portions of a map corresponding to the first sub-group of consumers in a first color;

instructions for displaying portions of the map corresponding to the second sub-group of consumers in a second color different than the first color; and instructions for displaying portions of the map corresponding to consumers belonging to neither the first sub-group of consumers nor the second sub-group of consumers in a third color different than the first color and different than the second color.

* * * * *